US009660185B2

(12) United States Patent
Gouk et al.

(10) Patent No.: US 9,660,185 B2
(45) Date of Patent: *May 23, 2017

(54) PATTERN FORTIFICATION FOR HDD BIT PATTERNED MEDIA PATTERN TRANSFER

(71) Applicant: Applied Materials, Inc., Santa Clara, CA (US)

(72) Inventors: Roman Gouk, San Jose, CA (US); Steven Verhaverbeke, San Francisco, CA (US); Alexander Kontos, Beverly, MA (US); Adolph Miller Allen, Oakland, CA (US); Kevin Moraes, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/157,120

(22) Filed: May 17, 2016

(65) Prior Publication Data

US 2016/0260896 A1 Sep. 8, 2016

Related U.S. Application Data

(63) Continuation of application No. 14/677,761, filed on Apr. 2, 2015, now Pat. No. 9,343,664, which is a
(Continued)

(51) Int. Cl.
*B44C 1/22* (2006.01)
*H01L 43/12* (2006.01)
(Continued)

(52) U.S. Cl.
CPC .............. *H01L 43/12* (2013.01); *G11B 5/746* (2013.01); *G11B 5/855* (2013.01); *H01F 41/34* (2013.01);
(Continued)

(58) Field of Classification Search
CPC . H01L 21/2855; H01L 21/3081; H01L 43/12; H01L 43/00
(Continued)

(56) References Cited

U.S. PATENT DOCUMENTS 4,098,917 A   7/1978   Bullock et al.
7,247,343 B2   7/2007   Suwa et al.
(Continued)

FOREIGN PATENT DOCUMENTS

| JP | 3844755 B2 | 11/2006 |
| JP | 2008135092 A | 6/2008 |
| KR | 2012-0008295 A | 1/2012 |

OTHER PUBLICATIONS

Wikipedia, The Free Encyclopedia; Physical Vapor Deposition; 2014; 5 total pages.
(Continued)

*Primary Examiner* — Binh X Tran
(74) *Attorney, Agent, or Firm* — Patterson + Sheridan, LLP (57) ABSTRACT

A method and apparatus for forming a magnetic layer having a pattern of magnetic properties on a substrate is described. The method includes using a metal nitride hardmask layer to pattern the magnetic layer by plasma exposure. The metal nitride layer is patterned using a nanoimprint patterning process with a silicon oxide pattern negative material. The pattern is developed in the metal nitride using a halogen and oxygen containing remote plasma, and is removed after plasma exposure using a caustic wet strip process. All processing is done at low temperatures to avoid thermal damage to magnetic materials.

20 Claims, 4 Drawing Sheets

Related U.S. Application Data continuation of application No. 13/800,362, filed on Mar. 13, 2013, now abandoned.

(60) Provisional application No. 61/726,234, filed on Nov. 14, 2012.

(51) Int. Cl.
| | |
|---|---|
| *G11B 5/74* | (2006.01) |
| *G11B 5/855* | (2006.01) |
| *H01F 41/34* | (2006.01) |
| *H01L 21/285* | (2006.01) |
| *H01L 21/308* | (2006.01) |

(52) U.S. Cl.
CPC ...... *H01L 21/2855* (2013.01); *H01L 21/3081* (2013.01)

(58) Field of Classification Search
USPC .......................................... 216/22, 75, 100
See application file for complete search history.

(56) References Cited

U.S. PATENT DOCUMENTS

| | | | | |
|---|---|---|---|---|
| 9,343,664 | B2* | 5/2016 | Gouk | G11B 5/855 |
| 2007/0059878 | A1* | 3/2007 | Chang | H01L 21/28052 438/233 |
| 2007/0285816 | A1 | 12/2007 | Deeman et al. | |
| 2009/0201722 | A1 | 8/2009 | Giridhar et al. | |
| 2009/0286397 | A1* | 11/2009 | Sadjadi | C23C 16/45523 438/680 |
| 2010/0232056 | A1* | 9/2010 | Fukushima | G11B 5/855 360/77.02 |
| 2010/0270710 | A1 | 10/2010 | Kang et al. | |
| 2011/0006034 | A1 | 1/2011 | Hilkene et al. | |
| 2011/0059235 | A1 | 3/2011 | Fukushima et al. | |
| 2011/0101247 | A1 | 5/2011 | Hilkene et al. | |
| 2012/0108485 | A1 | 5/2012 | Kamimura | |
| 2013/0056441 | A1 | 3/2013 | Kimura et al. | |
| 2013/0084688 | A1* | 4/2013 | O'Meara | H01L 21/0338 438/478 |
| 2013/0180948 | A1* | 7/2013 | Takizawa | G11B 5/855 216/22 |

OTHER PUBLICATIONS

PCT Notification of Transmittal of the International Search Report and the Written Opinion of the International Searching Authority for International Application No. PCT/US2013/068436 dated Feb. 18, 2014; 11 total pages.

* cited by examiner

PATTERN FORTIFICATION FOR HDD BIT PATTERNED MEDIA PATTERN TRANSFER

CROSS-REFERENCE TO RELATED APPLICATIONS

This application is a continuation of U.S. patent application Ser. No. 14/677,761 filed Apr. 2, 2015, set to issue on May 17, 2016, as U.S. Pat. No. 9,343,664, which claims benefit of U.S. patent application Ser. No. 13/800,362 filed Mar. 13, 2013, which claims the benefit of U.S. Provisional Patent Application Ser. No. 61/726,234 filed Nov. 14, 2012. Each of the aforementioned related patent applications is incorporated herein by reference.

FIELD

Embodiments described herein generally relate to methods and apparatus for producing magnetic media. More specifically, embodiments described herein relate to methods and apparatus for creating a pattern of magnetic properties in a magnetically active surface.

BACKGROUND

Magnetic media are important information storage devices, prominent examples of which are hard disk drives and magnetic memory devices such as MRAM. Magnetic media are generally characterized by a surface with an addressable pattern of magnetic properties that enable localized alteration of a detectable property of the surface. Typically, domains of magnetically active material are separated by domains of magnetically inactive material, so that a magnetic property of one domain, such as residual magnetism, can be made different from that of a neighboring domain.

Storage densities of magnetic media rise inexorably with time. As storage densities rise, the size of the addressable domains is reduced, and the separating domains grow smaller. Such trends create challenges in maintaining separation and addressability of the domains. For example, as magnetic domains grow smaller and closer together, maintaining a detectable separation of the magnetic fields present in the domains becomes more difficult. As storage densities have passed the 1 $Tb/in^2$ mark, bit patterning of magnetic surfaces has emerged as a promising path to further densification, but with domain sizes smaller than 50 nm, standard patterning techniques such as lithography are exhausted.

Nanoimprint patterning is currently used to create features smaller than 50 nm on magnetically active surfaces. A film of a curable mask material, typically an amorphous carbon material, is applied to a substrate having a magnetically active surface. The film is physically imprinted with a pattern and then cured to form a patterned mask that may have features smaller than 10 nm. Such a patterned mask forms the basis for a patterning operation resulting in a pattern of magnetic properties in the magnetically active surface.

A hardmask is frequently applied between the magnetically active surface and the patterned mask. The hardmask is patterned by etching through the patterned mask, and provides a more robust mask material for the subsequent processes that produce the magnetic pattern on the substrate. In many cases, the processes used to alter the magnetic properties of the substrate involve plasma implantation, which may degrade soft masking materials, altering the pattern formed therein. The hardmask provides better resistance to the plasma environment than does the patterned mask described above.

The hardmask is not perfect, however. For very small features, degradation observed in amorphous carbon hardmasks during, for example, plasma implantation patterning processes in enough to render the magnetic properties of the small domains indistinguishable. Thus, there is a continuing need for better patterning materials, processes, and apparatus for patterning of magnetic media.

SUMMARY OF THE INVENTION

Embodiments described herein disclose a method of patterning a substrate, comprising forming a metal nitride film on a magnetically active surface of the substrate, patterning the metal nitride film to form protected domains of the magnetically active surface separated by unprotected domains of the magnetically active surface, altering a magnetic property of the unprotected domains of the magnetically active surface by treating the substrate with a plasma, and removing the metal nitride film to form a surface of the substrate having a pattern of magnetic properties. The metal nitride film may be titanium nitride, aluminum nitride, tantalum nitride, tungsten nitride, or any combination thereof, and may be patterned by a nanoimprint process employing a pattern negative material that is substantially inert to a chemistry that etches the metal nitride layer. The metal nitride layer is then removed by a caustic wet strip process.

Embodiments described herein also disclose apparatus for forming a magnetically active layer having a pattern of magnetic properties on a substrate, the apparatus comprising a PVD chamber, a physical patterning chamber, an etch chamber, and a plasma immersion chamber. The apparatus may be a cluster tool or linear configuration and may include vacuum and non-vacuum processing. The apparatus may also include a wet strip chamber or module.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The inventors have discovered a new class of processes for creating a pattern of magnetic properties on a substrate, and apparatus for performing the processes. A structural substrate with a magnetically susceptible layer formed thereon is coated with a metal nitride film, which is patterned to form a mask. The substrate is then treated by exposure to a plasma, which alters magnetic properties of the magnetically susceptible layer according to the pattern of the mask. The mask is then stripped away, leaving a substrate with a magnetically susceptible layer having a pattern of magnetic properties.

Figure 1:
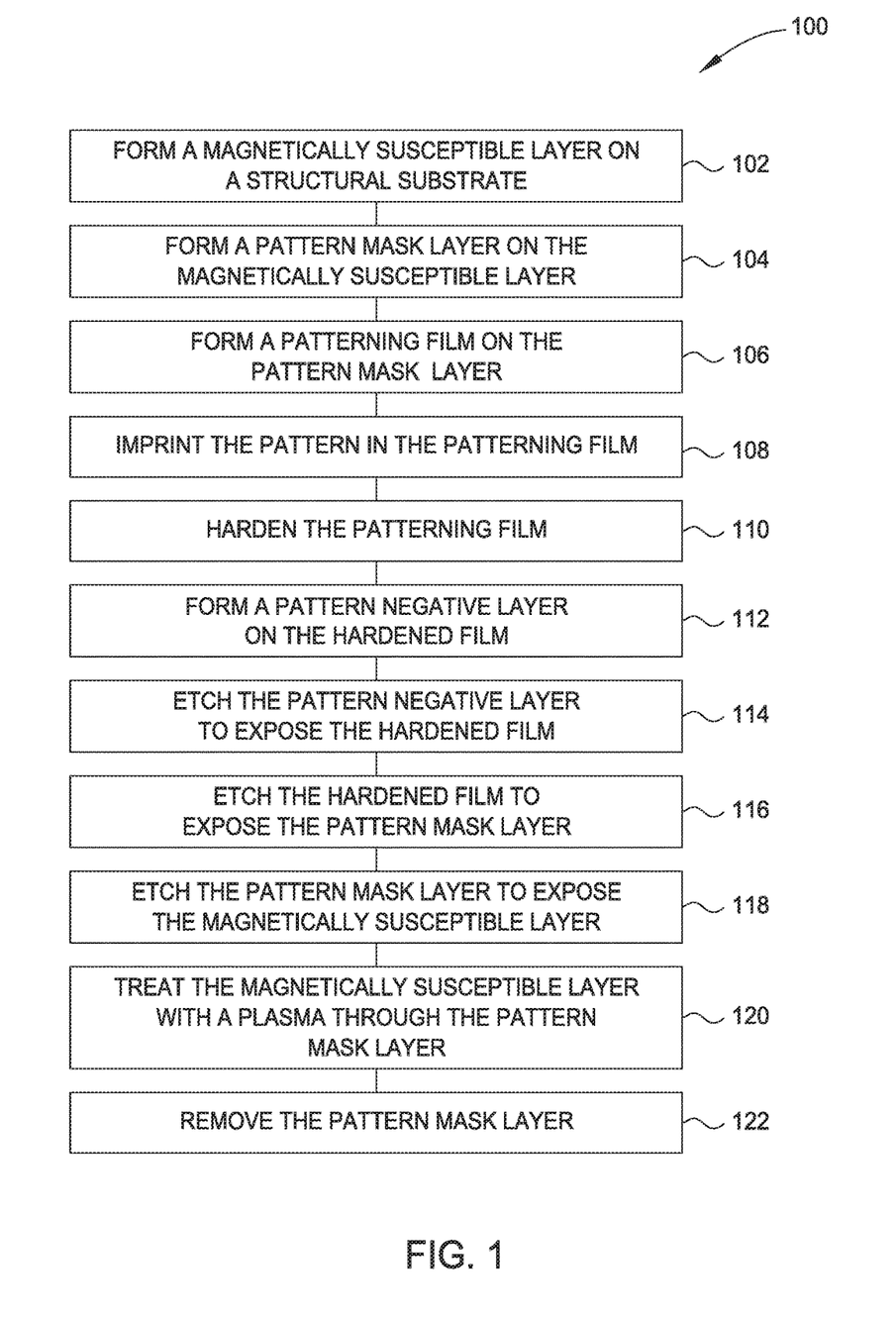
FIG. 1 is a flow diagram summarizing a method of forming a pattern of magnetic properties in a substrate according to one embodiment.

FIG. 1 is a flow diagram summarizing a method 100 according to one embodiment. The method 100 may be used to form a substrate having a pattern of magnetic properties consisting of a first plurality of domains having a first value of a magnetic property separated by a second plurality of domains having a second value of the magnetic property detectably different from the first value. Each of the domains in the first and second plurality of domains may have a dimension less than about 50 nm, such as between about 1 nm and about 25 nm, for example about 10 nm. The magnetic property may be coercivity, such that the first plurality of domains is more easily magnetized than the second plurality of domains.

At 102, a magnetically susceptible layer is formed on a structural substrate. The structural substrate is typically a substrate having little magnetic activity or susceptibility, such as a glass, plastic, ceramic, non-ferromagnetic metal, or any combination thereof. Examples include glass-ceramic composites, metal alloys, aluminum, and polycarbonate. The magnetically susceptible layer is typically formed by depositing a magnetically susceptible material on the substrate in a vapor deposition process. The magnetically susceptible material may be formed in multiple layers, each layer having the same or different composition. In one embodiment, a first layer of soft magnetic material such as iron or an iron/nickel alloy is formed over the substrate, and a second layer of magnetic material, such as a cobalt/nickel/platinum alloy, is formed over the first layer. These layers may be formed by any suitable method known to the art, such as physical vapor deposition, or sputtering, chemical vapor deposition, plasma-enhanced chemical vapor deposition, spin-coating, plating by electrochemical or electroless means, and the like. The magnetically susceptible layer is typically formed to a thickness less than about 1 μm, and may be formed to a thickness that is no more than about twice the feature size to be formed on the substrate. For example, if the magnetic pattern is to have a critical dimension of 10 nm, the magnetically susceptible layer may be formed with a thickness as little as 20 nm. Typical thickness of the magnetically susceptible layer for most embodiments is between about 5 nm and about 100 nm. The layer formed typically has a uniform magnetic property such as coercivity.

At 104, a pattern mask layer is formed on the magnetically susceptible layer. The pattern mask layer is formed of a material that has a substantial density to resist ion penetration during the subsequent magnetic patterning process, is removable by a low temperature process that does not damage the subjacent magnetically susceptible layer, withstands a post-etch cleaning process without loss of pattern resolution, and adheres well to any protective material that may be formed over the magnetically susceptible layer prior to forming the pattern mask layer, and to nanoimprint resist materials such as carbon. Metal nitrides, such as titanium nitride, aluminum nitride, tantalum nitride, tungsten nitride, and combinations thereof may be used. Carbon may also be used.

The pattern mask layer may be formed by any convenient process that is operable at a temperature that does not substantially alter the magnetic properties of the magnetically susceptible layer, such as less than about 200° C., for example between about 0° C. and about 150° C., such as about 100° C. Exemplary processes include vapor deposition processes such as CVD, which may be plasma enhanced, and PVD. A metal nitride layer or mixed metal nitride layer, as described above, may have a composition that varies within a range of about 10% from the stoichiometric composition of the metal nitride layer.

The pattern mask layer will eventually serve as a masking layer for an ion implantation process, so the thickness of the pattern mask layer is selected to prevent penetration of ions through the layer. When the pattern mask layer is patterned, portions of the subjacent magnetically susceptible layer are exposed by being uncovered or covered by only a thin remnant of the pattern mask layer while a thick covering of the pattern mask layer protects other portions. The thickness of the pattern mask layer is typically at least about 50% of the desired implantation depth in the magnetically susceptible layer, for example between about 2 nm and about 100 nm, for example about 10 nm.

As noted above, a thin protective layer may be formed between the magnetically susceptible layer and the pattern mask layer to reduce the opportunity for any damage to the magnetically susceptible layer during subsequent processing. The protective layer is typically a material interfacially compatible with the material of the pattern mask layer, frequently carbon, and may be amorphous or crystalline carbon. A diamond-like carbon layer having a thickness between about 2 nm and about 5 nm is often used, and may be deposited by vapor deposition such as CVD or PVD.

At 106, a curable or hardenable patterning film is formed on the pattern mask layer. The patterning film is typically applied as a liquid or as an otherwise pliable material, and may be deposited by any convenient method, including spinning on, spraying, dipping, and the like. An example of a curable film is an epoxy material. Hardenable films may be carbonaceous thermoplastic or thermoset polymer materials. The patterning film is typically formed to a thickness between about 10 nm and about 100 nm, which depends on the feature size to be formed in the film. Smaller features will support a thinner film. A thickness of 20 nm is typical. Temperature is normally about ambient temperature during the patterning film application, but may be elevated as high as about 200° C., if needed to reduce viscosity of the material to achieve a thin film. Viscosity of the film may also be managed by use of appropriate solvents such as hydrocarbons or other suitable organic solvents.

With regard to temperature of the various processes described herein, it should be noted that any of the various processes included in the method 100 may be performed at temperatures up to about 200° C., but it is preferred to minimize the exposure time of the substrate to elevated temperatures to avoid significantly degrading the magnetic properties of the magnetically susceptible layer. As more layers are deposited covering the magnetically susceptible layer, subsequent processing may be performed at higher temperatures because the layers formed on the magnetically susceptible layer insulate the magnetically susceptible layer to a degree. Additionally, if the magnetically susceptible layer is covered by one or more additional layers, subsequent processing may be performed at higher temperatures if the substrate is disposed on a substrate support having thermal control features that enable cooling of the substrate.

At 108, a physical imprint or nanoimprint process is performed on the patterning film before the film hardens, congeals, or cures. A template carrying the pattern to be imprinted is urged against the patterning film while the film is in a pliable or semi-pliable state, soft enough to deform under nominal pressure and to conform to the pattern of the template, which may be metal, ceramic, or glass. Pliability of the patterning film during imprinting may be managed by applying heat to the film, for example by heating the template. Holes are resolved in the patterning film that have width of 5-50 nm and depth of 5-50 nm, typically with a footing of resist material at the bottom of each hole.

The patterning film is hardened at 110. The patterning film may be hardened partially or completely, or cured partially or completely, while in contact with the template if the film has a viscosity so low as to flow in the absence of contact with the template. When the patterning film has congealed sufficiently, the template is removed, leaving a pattern of thick and thin areas corresponding to the pattern of the template. The film is then fully hardened. After hardening, the patterning film may be etched or ashed briefly to optimize the film thickness and hole dimensions. If desired, the footing at the bottom of the holes may be removed.

At 112, a pattern negative layer is formed on the patterning film. The pattern negative layer is typically a material that has structural strength and is reactive to a chemistry that is not substantially reactive to the material of the patterning film. The pattern negative layer may be a material that is resistant to a reactive oxygen atmosphere, for example, if the patterning film is a carbonaceous material. Oxides such as silicon oxides, metal oxides, ceramics, and silicon-metal mixed oxides or ceramics, nitrides such as silicon nitrides, metal nitrides, and silicon-metal mixed nitrides, oxynitrides such as silicon oxynitrides, metal oxynitrides, and silicon-metal mixed oxynitrides, oxycarbides such as silicon oxycarbides, metal oxycarbides, and silicon-metal mixed oxycarbides, silicates such as metal silicates, carbonates such as metal carbonates, silicon carbonates, and silicon-metal mixed carbonates, or any combination thereof may be used as a pattern negative layer. The pattern negative layer may be formed as a single layer, as multiple distinct layers, as multiple layers having graded composition, or as a single layer having graded composition.

The pattern negative layer is typically formed by a vapor deposition process that maintains a temperature of the magnetically susceptible layer at or below about 200° C. during the process. The vapor deposition process itself may be performed at a temperature at or below about 300° C., relying on the patterning layer and the pattern mask layer to insulate the magnetically susceptible layer during the vapor deposition process, if the duration of the vapor deposition process is less than the time required to heat the magnetically susceptible layer to 200° C. through the patterning layer and the pattern mask layer. Alternately, the substrate may be cooled, for example using a substrate support with thermal control capabilities, to maintain the magnetically susceptible layer at or below 200° C. If the substrate is cooled, the vapor deposition process may be performed at a temperature of about 500° C. or less, and a temperature gradient of about 300° C. or more is maintained in the pattern mask layer and the patterning layer. Good adhesion and/or small difference in thermal expansion coefficient between the pattern mask layer and the patterning layer are desired at this point to avoid delamination. Metal nitrides such as titanium nitride adhere well to carbon.

The vapor deposition process may be a PVD process, either under inert or reactive atmosphere, or a CVD process, which may be plasma enhanced. The process may be arranged to deposit the pattern negative layer conformally or in a blanket manner. Typically, the pattern features formed in the patterning layer are filled by the material of the pattern negative layer. A conformal deposition process may be used to minimize formation of voids in the pattern negative layer. Typical conformal deposition processes include plasma enhanced CVD processes that use a weak electrical bias applied to the substrate to equalize the vapor phase composition at the top and bottom of a pattern feature.

At 114, the pattern negative layer is exposed to a reactive chemistry that preferentially reacts with the material of the pattern negative layer to remove material from the pattern negative layer. The reactive chemistry may etch the pattern negative layer or may transform the material of the pattern negative layer to a material that may be removed by a subsequent process such as a clean process or a sublimation process. The hardened patterning film is exposed during removal of material from the pattern negative layer such that the surface of the substrate has alternating domains of pattern negative material and patterning material covering the pattern mask layer. The pattern negative material may be over-removed or over-etched, if desired, to provide any desired thickness of the pattern negative material, but typically the pattern negative material is removed until the hardened patterning film is exposed. Temperature of the magnetically susceptible film is maintained below about 200° C. during removal of the pattern negative material. As indicated above, this may be accomplished by performing the pattern negative material removal at a temperature below about 300° C., relying on the pattern negative film and the hardened patterning film to insulate the magnetically susceptible layer, or the substrate may be cooled while the removal process is performed at a temperature less than about 500° C.

At 116, the hardened patterning film is removed using a reactive chemistry that preferentially reacts with the hardened patterning film. If the hardened patterning film is a carbonaceous material and the pattern negative film is an oxygen resistant material, the hardened patterning film may be removed by exposure to a reactive oxygen environment such as an oxygen containing plasma, which may be an in-situ generated plasma or a remote plasma formed from gases such as $O_2$, $O_3$, nitrogen oxides, carbon oxides, and any mixture thereof. Removal of the hardened patterning film may be performed at a temperature below about 200° C., since only the pattern mask layer, and optionally the protective layer, insulates the magnetically susceptible layer from the environment in this operation. Alternately, as described above, the substrate may be cooled. Following this process, the substrate surface features the pattern negative layer with a negative of the imprinted pattern, through which the pattern mask layer is exposed.

At 118, the exposed portions of the pattern mask layer are removed to expose the magnetically susceptible layer, or optionally the protective layer. The pattern mask layer is removed using a low temperature process in which the substrate surface is exposed to a chemistry that preferentially removes the pattern mask layer without damaging the magnetically susceptible layer. A remote plasma may be used in some cases to activate the chemistry without exposing the substrate to a high temperature. Where a metal nitride material is used for the pattern mask layer, the pattern mask layer, for example, a titanium nitride film may be etched using a remote plasma comprising $Cl_2$ and $O_2$, for example, a $HBr/Cl_2/O_2$ or $Cl_2/CF_4/O_2$ gas mixture, which may be activated by remote plasma, while the substrate is at near ambient temperature. The substrate may be biased at a low bias power, for example about 25-35 W, during removal of the pattern mask material. The bias power may be DC, pulsed DC, or RF (e.g. 13.56 MHz). The chemistry of the removal process is selected to provide a step coverage (i.e.

ratio of width at feature bottom to width at feature top) exceeding 80%, such as between about 85% and 105%, for example about 90%. A step coverage near 100% provides collimation of ions during the subsequent plasma exposure and penetration process, leading to high differentiation between exposed regions and protected regions.

The substrate surface may be over-etched during operation 118, if desired. Over-etching may be useful in some embodiments to maximize the utility of a subsequent magnetic patterning process that features ion implantation. The result of patterning the pattern mask layer is that the magnetically susceptible layer will be covered with a pattern mask layer that has thick regions and thin regions so that a subsequent ion exposure process will penetrate the thin regions and implant ions into the magnetically susceptible layer while the ions are blocked by the thick regions. Over-etching the pattern mask layer results in a thin exposure layer covering the exposed regions of the magnetically susceptible layer. A thinner layer covering the exposed regions allows ion penetration at lower energies, reducing the amount of energy dissipated to the pattern mask layer as heat, and thereby reducing the overall heat exposure of the magnetically susceptible layer during the ion exposure process. Additionally, ion penetration is improved increasing the differentiation of the magnetic pattern. When an over-etch is employed, the over-etch time is typically between about 10% and about 20%, for example about 15%. For example, the pattern mask layer may be etched for 35 seconds, of which about 5 seconds is over-etch.

In some embodiments, etching of the pattern mask layer may produce an imperfect transfer of the pattern. Some metal nitride layers, such as TiN, when deposited by PVD at low temperatures, produce a layer with elevated crystallinity, and etching of such layers may produce bridging across recessed etched into the film. Also, in embodiments featuring over-etching, etch residues may form on the substrate surface. A clean process may be employed following etching to address both conditions. A wet clean process using aqueous HF may be employed to remove etch residues and to clear any filaments bridging the recesses prior to plasma exposure.

A protective overcoat may be formed over the substrate, covering the columns of hardmask and pattern mask layer, and the exposed portions of the magnetically susceptible layer, if desired. The protective overcoat may improve pattern stability during subsequent processing by providing a low penetration covering over the pattern mask layer. Using a protective overcoat in this manner allows for higher energy processes to implant ions in the exposed regions of the magnetically susceptible layer, resulting in greater differentiation between the treated areas and the non-treated areas.

A metal such as tungsten (W) may be used for such an overcoat. Tungsten may be coated over the substrate to a thickness between about 1 nm and about 15 nm, such as between about 2 nm and about 10 nm, for example about 5 nm. The thickness of the overcoat is selected based on the critical dimension of the pattern formed in the pattern mask layer. Tungsten is a high molecular weight material that may be coated onto the substrate without damaging the magnetically susceptible layer, and may be removed in a wet strip process also without damaging the magnetically susceptible layer.

Tungsten may be coated over the substrate in a non-conformal PVD process to achieve thicker coating on the pattern mask layer than on the exposed regions of the magnetically susceptible layer. In this way, an ion-stopping overcoat may be applied selectively to the pattern mask layer while preserving the nominal exposure of the magnetically susceptible layer to ion implantation. Tungsten may be coated over such a substrate in a PVD chamber.

At 120, the magnetically susceptible layer is treated with a plasma through the pattern mask layer, and optionally through the protective overcoat, which carries the pattern originally imprinted into the patterning layer at 108. The substrate may be immersed in an in-situ or remote plasma, which may be undirected or directed by biasing the substrate, or the substrate may be subjected to an ion beam or neutral beam implantation process. The ions generally penetrate the magnetically susceptible layer through the remaining thin portions of the pattern mask layer covering the exposed areas of the magnetically susceptible layer, if any thin layer remains, and are blocked by the thick portions of the pattern mask layer. The pattern features left in the pattern mask layer typically have substantially straight vertical side walls, which collimate the ions reaching the magnetically susceptible layer so that penetration into the magnetically susceptible layer is mostly vertical. Alteration of the magnetic properties in the exposed regions therefore has a high abruptness at the interface between the exposed regions and the protected regions, typically at least about 10%/Å and as high as 50%/Å within 5Å of the substrate surface. Abruptness declines with depth from the surface as ion penetration is diverted from vertical by passage through the magnetically susceptible material. For this reason, desired penetration is often shallower with smaller critical dimensions.

At 122, the pattern mask layer is removed from the substrate, leaving a pattern of magnetic properties in the magnetically susceptible layer. To avoid substantially heating the substrate, a wet strip process is employed to remove the pattern mask layer. The wet strip process uses a chemistry that removes the pattern mask layer without damaging the magnetically susceptible layer. It should be noted that the chemistry of the magnetically susceptible layer may have been substantially altered by ion implantation, so that a chemistry suitable for the unaltered regions of the layer may be unsuitable to the altered regions. In this case, if a metal nitride material is used for the pattern mask layer, the metal nitride material may be removed by a solution of tetramethylammonium hydroxide (TMAH) and hydrogen peroxide, optionally dissolved in water, with pH less than about 12. A molar ratio of the TMAH to the peroxide may be between about 1:1 and about 5:1, for example, about 3:1, and any amount of water may be mixed in. The wet strip process is performed at a temperature between room temperature and about 100° C., beyond which boiling and decomposition of the wet strip solution becomes undesirable. A typical temperature regime is between about 75° C. and about 85° C. The substrate is typically stripped for between about 3 seconds and about 30 seconds, such as between about 5 seconds and about 15 seconds, for example about 6 seconds.

If a tungsten overcoat layer is used, a solution of 1 part hydrogen peroxide in 1 to 5 parts water will strip the tungsten overcoat layer at a temperature between room temperature and 100° C. In an embodiment where tungsten is coated over titanium nitride, the tungsten may be removed by a hydrogen peroxide solution, after which TMAH may be added to the solution to remove the titanium nitride.

The resulting substrate has a magnetically active layer with a pattern of magnetic properties. The topography of the substrate is substantially unchanged by the overall patterning process, with RMS or average roughness, for example $R_a$, $R_q$, or $R_{rms}$ roughness, at most about 20 Å. For most embodiments, roughness after the magnetic patterning process is less than about 10 Å. The pattern of magnetic properties available using the methods described herein has a periodicity of 100 nm or less (i.e. 50 nm domains having a first value of a magnetic property separated by 50 nm domains having a second value of the magnetic property detectably different from the first value), in many cases as low as 2 nm. Periodicity of 20 nm is commonly selected. In many embodiments, a magnetic property such as magnetic coercivity is altered by 50-100%, for example by 60-80%, from one domain to the next. Note that in some embodiments, the magnetic property may be effectively undetectable in the exposed regions following the ion treatment. In one example, the methods described herein may be used to fabricate a substrate having a surface that has a pattern of magnetic coercivity varying from about 1500 Oe in one domain to about 300 Oe or less in an adjacent domain, where each domain has a maximum dimension of about 10 nm.

Figure 2:
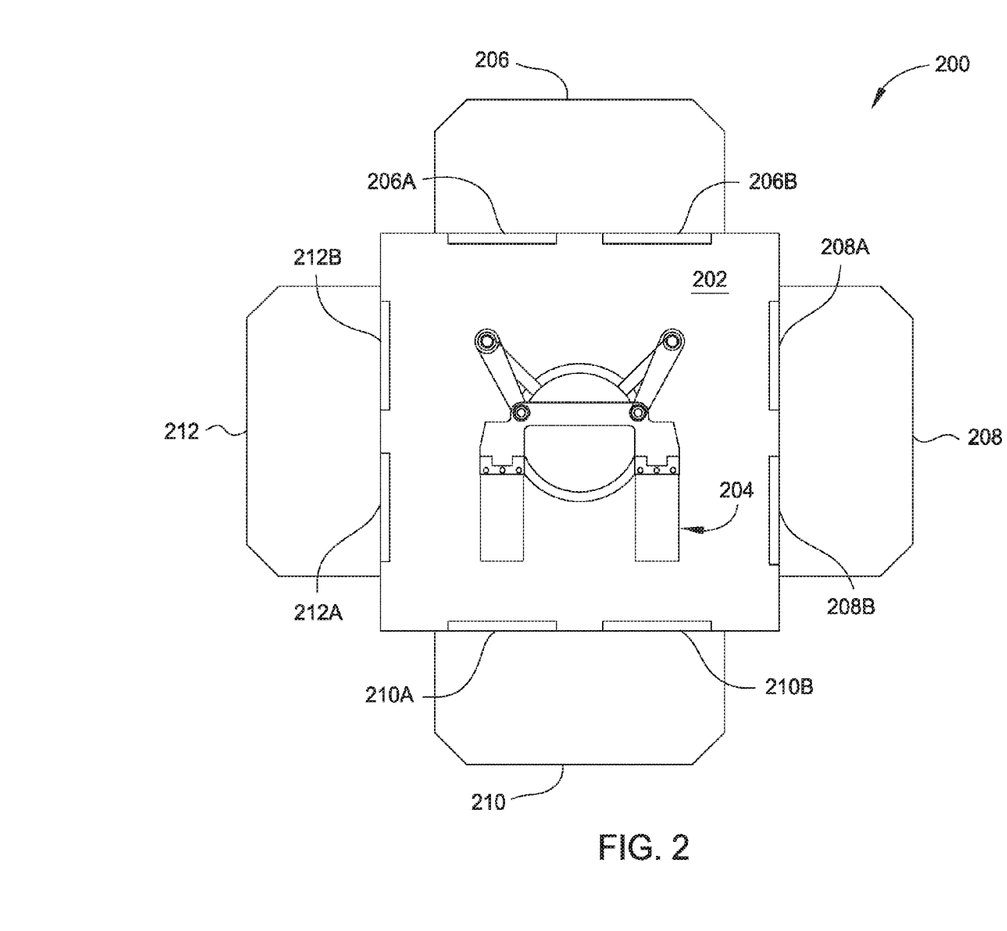
FIG. 2 is a plan view of an apparatus capable of performing all or part of the method of FIG. 1 according to one embodiment.

FIG. 2 is a plan view of an apparatus 200 according to another embodiment. The apparatus 200 may be used to practice methods described herein. The apparatus 200 comprises a transfer chamber 202 with a robot 204 for manipulating substrates. Coupled to the transfer chamber is an input/output chamber 206, a first processing chamber 208, a second processing chamber 210, and a third processing chamber 212. Each of the chambers 206, 208, 210, and 212 is a dual chamber comprising two subchambers as indicated by the respective coupling for each subchamber to the transfer chamber 202. The input/output chamber 206 has two couplings 206A and 206B for two input/output subchambers. The first processing chamber 208 has two couplings 208A and 208A for two subchambers. The second processing chamber 210 has two couplings 210A and 210B for two subchambers. The third processing chamber 212 has two couplings 212A and 212B for two subchambers.

In one embodiment, the apparatus 200 may be a vacuum processing apparatus that performs any portions of the method 100 up to application of a liquid patterning film as in operation 106 that are performed under vacuum conditions. According to such an embodiment, each of the first, second, and third processing chambers 208, 210, and 212, is a deposition chamber, which may feature a PVD and/or a CVD chamber, which may be plasma enhanced. In operation of such an embodiment, a substrate will enter the apparatus 200 through the input/output chamber 206 and be delivered to the first processing chamber 208 by the robot 204. A magnetically susceptible layer, including a soft magnetic underlayer, may be formed on the substrate in the first processing chamber 208 by a PVD process. The substrate is then delivered to the second processing chamber 210 by the robot 204, where a protective layer, such as a diamond like carbon layer, is formed on the substrate by PVD or CVD. The substrate is then delivered to the third processing chamber 212, where a pattern mask layer is formed on the substrate by PVD or CVD. The substrate is then delivered to the input/output chamber 206 by the robot and exits the apparatus 200.

In another embodiment, the apparatus 200 may be a vacuum processing apparatus that performs any portions of the method 100 following hardening of the patterning film as in operation 110 that are performed under vacuum conditions. According to such an embodiment, the first processing chamber 208 may be a deposition chamber, such as a PVD or CVD chamber, the second chamber 210 may be a removal chamber, such as an etch or sublimation chamber, and the third chamber 212 may be a plasma exposure chamber, such as a plasma immersion or plasma ion implantation chamber.

In operation, according to such an embodiment, a substrate may be delivered to the apparatus 200 having a magnetically susceptible layer, an optional protective layer such as a diamond like carbon layer, a pattern mask layer, and a hardened patterning layer with an imprinted pattern delivered to the input/output chamber 206. The robot 204 then delivers the substrate to the first processing chamber 208 where a pattern negative layer is deposited over the hardened patterning layer. The robot 204 then delivers the substrate to the second processing chamber 210, where the pattern negative layer is etched or removed to expose the hardened patterning layer, the hardened patterning layer is etched or removed to expose the pattern mask layer, and the pattern mask layer is etched or removed to expose the magnetically susceptible layer. The robot 204 then delivers the substrate to the plasma exposure chamber 212, where the substrate is subjected to a plasma process to produce a pattern of magnetic properties in the magnetically susceptible layer. The robot 204 then delivers the substrate to the second processing chamber 210 where the pattern mask layer is removed. The robot 204 then delivers the substrate to the input/output chamber 206, and the substrate exits the apparatus 200.

Figure 3:
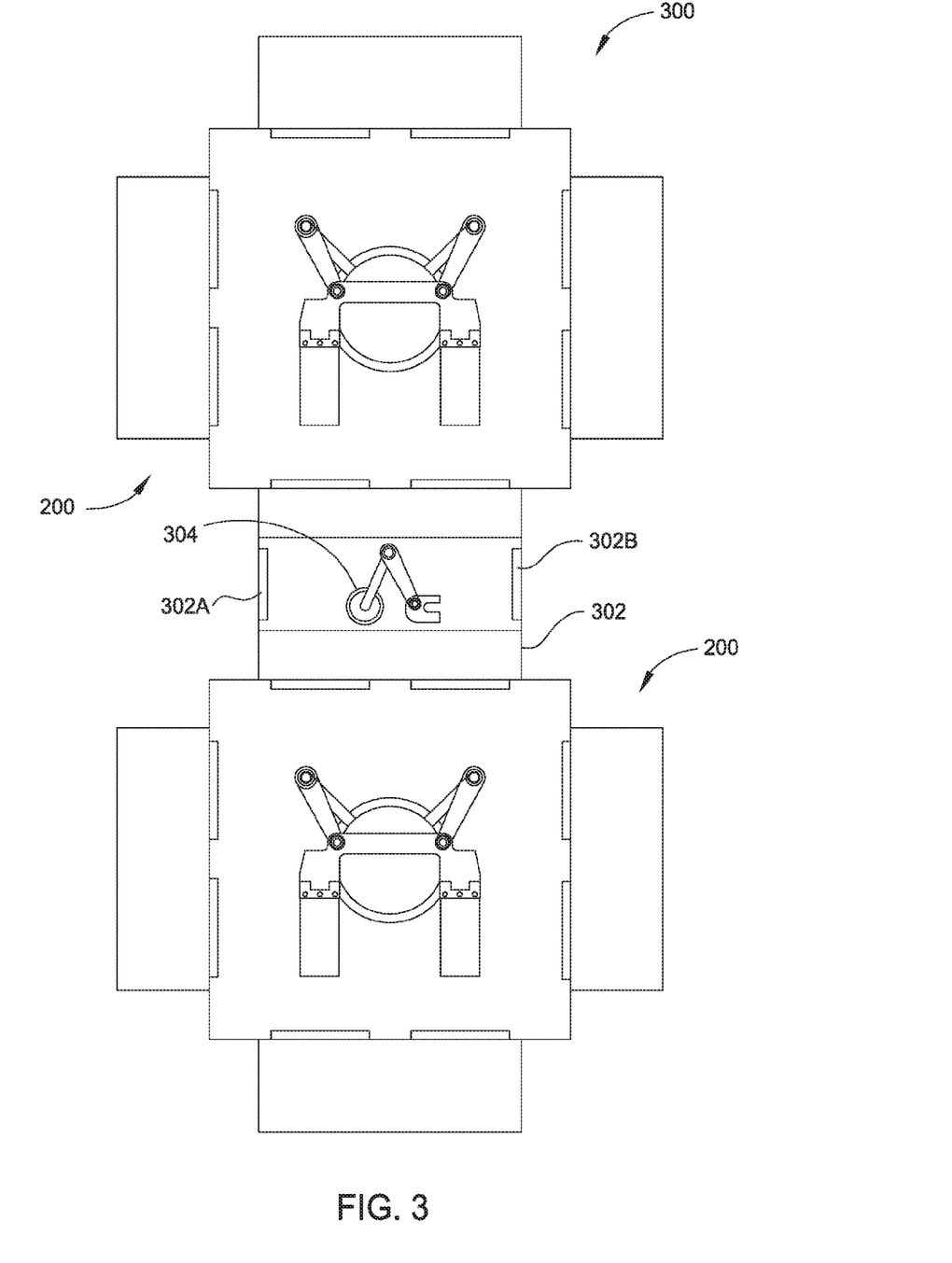
FIG. 3 is a plan view of an apparatus according to another embodiment.

FIG. 3 is a plan view of an apparatus 300 according to another embodiment. The apparatus 300 is a dual version of the apparatus 200 with a substrate coordination chamber 302, with an entry door 302A and an exit door 302B, coupling a first processing section 200A and a second processing section 200B together. The first processing section 200A may correspond to the first embodiment of the apparatus 200 described above, while the second processing section 200B may correspond to the second embodiment of the apparatus 200 described above. In this way, one apparatus may perform all the vacuum processing involved in the method 100. A substrate may be coated with a magnetically susceptible layer and a protective layer in the first processing section 200A, exit the apparatus 300 to perform non-vacuum operations such as liquid patterning layer formation, imprinting, and hardening, and then developed and patterned in the second processing section 200B, exiting the apparatus 300 with a magnetically susceptible layer having a desired pattern of magnetic properties.

Figure 4:
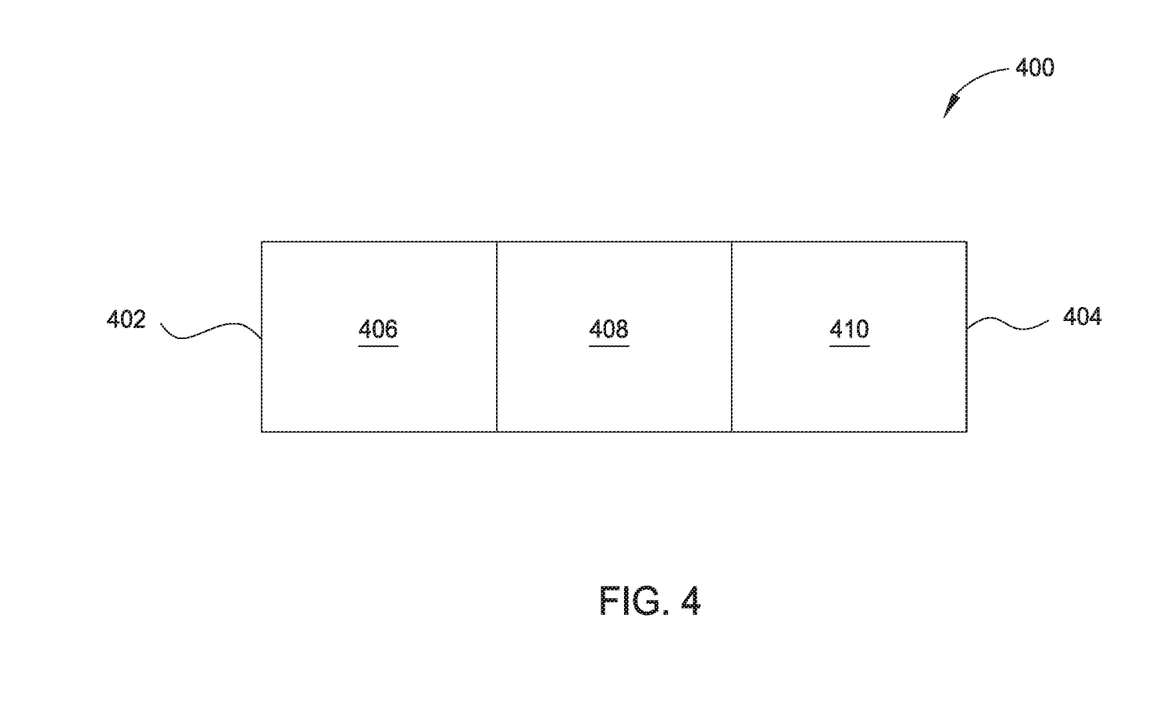
FIG. 4 is a plan view of an apparatus according to yet another embodiment.

FIG. 4 is a plan view of an apparatus 400 for forming substrates with a pattern of magnetic properties, as described herein. The apparatus 400 is a linear apparatus that can perform methods described herein, in contrast to the cluster tool apparatus of FIGS. 2 and 3. Substrates enter the apparatus at a first end 402 thereof and exit at a second end 404 thereof. In a first module 406, vacuum processing steps prior to imprinting, including PVD deposition of magnetically susceptible materials, diamond like carbon, and TiN pattern mask materials, may be performed. In a second module 408, imprint processing, including resist application, imprinting, and hardening, may be performed at near atmospheric pressures. In a third module 410, vacuum processing steps subsequent to imprinting, including pattern negative deposition and etching, resist removal, pattern mask layer etching, and plasma exposure may be performed. The third module 410 may also include a wet stripping process to remove the pattern mask layer.

In one example, a substrate having a magnetically susceptible layer is subjected to a vapor deposition process to deposit a diamond like carbon protective layer 2 nm thick. A TiN layer is then deposited to a thickness of about 30 nm in a high-density PVD sputtering process at a temperature less than about 200° C. A carbonaceous liquid nanoimprint resist is formed on the TiN layer to a thickness of about 20 nm by a spin-on process at room temperature and atmospheric pressure, and is then imprinted using a metal template having a bit pattern with periodicity of about 20 nm. Holes about 10-15 nm deep are resolved in the nanoimprint resist. After the nanoimprint resist is hardened, a blanket silicon oxide film is formed over the patterned resist by plasma enhanced CVD using silane and oxygen at a temperature of 100° C.-150° C. The holes are filled and a blanket of oxide about 10 nm deep is deposited over the resist film. The silicon oxide is then etched using an appropriate halogen chemistry, for example, fluorine, by a plasma etch or remote plasma process such as the SICONI® process available from Applied Materials, Inc., of Santa Clara, Calif. The oxide etchback process is performed at a temperature of 50° C.-150° C. The oxide etchback process is discontinued when the thick portions of the patterning layer are exposed. Then, an oxygen chemistry such as oxygen plasma is used to remove the carbonaceous imprint resist, exposing the pattern mask layer between pillars of oxide.

The TiN layer is then etched using a $HBr/Cl_2/O_2$ gas mixture, that is, by volume, about 40% HBr, 40% $Cl_2$, and 20% $O_2$ activated by remote plasma using 13.56 MHz RF power. An RF bias at the same frequency is applied to the substrate at about 30 W for about 30-35 seconds to etch the TiN layer, exposing the carbon protective layer. The substrate is left with a magnetically susceptible layer, covered by a diamond like carbon protective layer and a patterned $TiN/SiO_x$ layer, the pattern having step coverage exceeding 80%.

The substrate is then cleaned in a weak HF solution (e.g. 1:50 molar $HF/H_2O$), dried, and subjected to a plasma exposure process. The plasma exposure process is typically performed in a plasma immersion chamber at a pressure of 10 Torr or less using any convenient precursor as a plasma source. The substrate is biased using RF bias at 50 W or less to provide direction and kinetic energy to the ions for penetration of the magnetically susceptible layer through the pattern mask layer. The plasma exposure process may be performed in stages to avoid overheating substrates during the process. Typically, the substrate will be exposed to plasma up to about 60 seconds, followed by a similar cooling period, in a single exposure cycle, which may be repeated as desired to produce the desired patterning result. During the cooling period, a cooling gas is typically circulated around the substrate.

Following plasma exposure, the substrate is subjected to a wet strip process. A solution of 50% of a $TMAH/H_2O_2$ mixture in water having a pH of about 10 is applied to the substrate at a temperature of about 75° C. for about 6 seconds. The TMAH/peroxide mixture is a molar ratio of TMAH to hydrogen peroxide of about 3:1.

It should be noted that in all the methods and apparatus described above, substrates may be processed individually or in groups. Substrates to be processed in groups may be positioned on a carrier, and the carrier may be transported through the various processing stages. Also, in many embodiments, substrates are processed on both major surfaces to produce a magnetically patterned layer on both sides of each substrate. Thus, the methods and apparatus described herein may include methods and apparatus for flipping substrates. An example of a substrate carrier and a substrate handling apparatus including substrate flipping are both described in commonly owned U.S. patent application Ser. No. 12/984,528, published Jul. 7, 2011, as United States Patent Publication 2011/0163065, which is incorporated herein by reference.

While the foregoing is directed to embodiments of the present invention, other and further embodiments of the invention may be devised without departing from the basic scope thereof, and the scope thereof is determined by the claims that follow.

The invention claimed is:

1. A method of patterning a substrate, comprising:
   forming a first layer on a magnetically active surface of a substrate;
   forming a metal nitride film on the first layer by a PVD process at a temperature less than about 200° C.;
   forming a second layer over the metal nitride film;
   physically imprinting the second layer to form a pattern;
   forming a third layer over the second layer;
   removing a portion of the third layer;
   removing a portion of the second layer;
   patterning the metal nitride film to form protected domains of the magnetically active surface separated by unprotected domains of the magnetically active surface;
   altering a magnetic property of the unprotected domains of the magnetically active surface by treating the substrate with a plasma; and
   removing the metal nitride film.

2. The method of claim 1, wherein the first layer comprises carbon.

3. The method of claim 1, wherein the metal of the metal nitride film comprises one or more metals from the group consisting of titanium, aluminum, tantalum, and tungsten.

4. The method of claim 1, wherein the metal nitride film is a titanium nitride film.

5. The method of claim 1, wherein the removing a portion of the third layer comprises etching the third layer using halogen chemistry.

6. The method of claim 1, wherein the removing a portion of the second layer comprises applying an oxygen plasma to the substrate.

7. The method of claim 1, wherein the patterning the metal nitride film comprises immersing the substrate in an in-situ plasma and applying RF bias to the substrate.

8. The method of claim 1, wherein the patterning the metal nitride film comprises exposing the substrate to a remote plasma.

9. The method of claim 8, wherein the exposing the substrate to a remote plasma comprises overetching the substrate.

10. The method of claim 8, wherein the patterning the metal nitride film further comprises etching with a gas mixture comprising HBr, $Cl_2$ and $O_2$.

11. The method of claim 8, wherein the patterning the metal nitride film further comprises etching with a gas mixture comprising $CF_4$, $Cl_2$ and $O_2$.

12. The method of claim 1, further comprising:
    after the patterning the metal nitride film and before treating the substrate with a plasma, forming a protective overcoat over the patterned metal nitride film.

13. The method of claim 12, wherein the protective overcoat comprises tungsten.

14. The method of claim 12, wherein the protective overcoat is formed by a physical vapor deposition process.

15. The method of claim 1, wherein the treating the substrate with a plasma comprises immersing the substrate in the plasma.

16. The method of claim 15, wherein the treating the substrate with a plasma further comprises biasing the substrate.

17. The method of claim 1, wherein the removing the metal nitride film comprises a wet strip process.

18. The method of claim 17, wherein the wet strip process comprises applying a solution of tetramethylammonium hydroxide and hydrogen peroxide in water to the substrate.

19. The method of claim 17, wherein the wet strip process is performed at a temperature below about 100° C.

20. A method of patterning a substrate, comprising:
forming a first layer comprising carbon on a magnetically active surface of the substrate;
forming a titanium nitride film on the first layer by a PVD process at a temperature less than about 200° C.;
forming a second layer over the titanium nitride film;
physically imprinting the second layer to form a pattern;
forming a third layer over the second layer;
etching the third layer using halogen chemistry;
removing a portion of the second layer by applying an oxygen plasma to the substrate;
patterning the titanium nitride film by exposing the substrate to a remote plasma comprising $Cl_2$ and $O_2$ to form protected domains of the magnetically active surface separated by unprotected domains of the magnetically active surface;
forming a coating over the patterned metal nitride film, wherein the coating comprises tungsten;
altering a magnetic property of the unprotected domains of the magnetically active surface by exposing the substrate to a plasma; and
removing the titanium nitride film.

\* \* \* \* \*